(12) United States Patent
Saito et al.

(10) Patent No.: US 11,981,993 B2
(45) Date of Patent: May 14, 2024

(54) FORMING METHOD OF COMPONENT AND SUBSTRATE PROCESSING SYSTEM

(71) Applicant: Tokyo Electron Limited, Tokyo (JP)

(72) Inventors: Michishige Saito, Miyagi (JP); Kazuya Nagaseki, Miyagi (JP); Shota Kaneko, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/646,277

(22) PCT Filed: May 10, 2019

(86) PCT No.: PCT/JP2019/018735
§ 371 (c)(1),
(2) Date: Mar. 11, 2020

(87) PCT Pub. No.: WO2019/221023
PCT Pub. Date: Nov. 21, 2019

(65) Prior Publication Data
US 2021/0366697 A1    Nov. 25, 2021

(30) Foreign Application Priority Data
May 15, 2018  (JP) ................... 2018-094129

(51) Int. Cl.
| C23C 16/44 | (2006.01) |
| B23K 26/144 | (2014.01) |
| B23K 26/34 | (2014.01) |
| B33Y 10/00 | (2015.01) |
| B33Y 50/00 | (2015.01) |
| B33Y 80/00 | (2015.01) |
| C23C 16/48 | (2006.01) |
| H01J 37/32 | (2006.01) |

(52) U.S. Cl.
CPC ........ *C23C 16/4404* (2013.01); *B23K 26/144* (2015.10); *B23K 26/34* (2013.01); *B33Y 10/00* (2014.12); *B33Y 80/00* (2014.12); *C23C 16/44* (2013.01); *C23C 16/483* (2013.01); *C23C 16/487* (2013.01); *H01J 37/32477* (2013.01);
(Continued)

(58) Field of Classification Search
CPC . C23C 16/4404; C23C 16/483; C23C 16/487; C23C 16/44; B23K 26/144; B23K 26/34; B33Y 10/00; H01J 37/32477; H01J 37/32642; H01J 37/32935;
(Continued)

(56) References Cited

U.S. PATENT DOCUMENTS

2002/0072240 A1   6/2002  Koike
2004/0173319 A1*  9/2004  Suzuki ............. H01L 21/67069
                                                  156/345.51
(Continued)

FOREIGN PATENT DOCUMENTS

CN   104674210 A  *  6/2015  ........... B23K 26/032
JP   2015-043470 A     3/2015
(Continued)

OTHER PUBLICATIONS

International Search Report for International Application No. PCT/JP2019/018735, dated Jun. 25, 2019.

*Primary Examiner* — Jose I Hernandez-Kenney
(74) *Attorney, Agent, or Firm* — Pearne & Gordon LLP

(57) ABSTRACT

A forming method of a component used in a plasma processing apparatus includes irradiating an energy beam to a source material of the component while supplying the source material based on a surface state of the component.

6 Claims, 5 Drawing Sheets

(52) U.S. Cl.
CPC .. *H01J 37/32642* (2013.01); *H01J 37/32935* (2013.01); *B33Y 50/00* (2014.12); *H01J 2237/332* (2013.01); *H01J 2237/334* (2013.01)

(58) Field of Classification Search
CPC .......... H01J 2237/332; H01J 2237/334; H01L 21/3065; H01L 21/67069; H05H 1/46
See application file for complete search history.

(56) References Cited

U.S. PATENT DOCUMENTS

| | | |
|---|---|---|
| 2010/0314356 A1* | 12/2010 | Nagayama .......... C23C 16/4418 216/52 |
| 2011/0235056 A1* | 9/2011 | Matsudo .............. G01B 9/0209 356/630 |
| 2014/0353862 A1* | 12/2014 | Erdman ................ B29C 64/295 425/17 |
| 2016/0181142 A1* | 6/2016 | Raj .................... H01L 21/67017 264/129 |
| 2016/0216185 A1* | 7/2016 | Gottscho .......... H01J 37/32009 |
| 2016/0233060 A1* | 8/2016 | Narendrnath ..... H01J 37/32477 |
| 2017/0152968 A1* | 6/2017 | Raj .................... H01L 21/68792 |
| 2019/0022803 A1* | 1/2019 | Srinivasan ........... B23K 26/342 |

FOREIGN PATENT DOCUMENTS

| | | |
|---|---|---|
| JP | 2015-506855 A | 3/2015 |
| JP | 2017-060735 A | 3/2017 |
| JP | 2018-507327 A | 3/2018 |
| WO | 2013/086577 A1 | 6/2013 |
| WO | 2016/126403 A1 | 8/2016 |
| WO | 2016/178777 A1 | 11/2016 |

* cited by examiner

FORMING METHOD OF COMPONENT AND SUBSTRATE PROCESSING SYSTEM

CROSS-REFERENCE TO RELATED APPLICATIONS

This Application is a U.S. national phase application under 35 U.S.C. § 371 of PCT Application No. PCT/JP2019/018735 filed on May 10, 2019, which claims the benefit of Japanese Patent Application No. 2018-094129 filed on May 15, 2018, the entire disclosures of which are incorporated herein by reference.

TECHNICAL FIELD

The various embodiments described herein pertain generally to a forming method of a component and a substrate processing system.

BACKGROUND ART

With demands for high-aspect ratio etching and miniaturization, there is performed a plasma process in which a high frequency power for bias voltage generation is supplied at a high power level. Accordingly, the high aspect ratio etching and miniaturization can be realized by increasing the attraction of ions onto a substrate (see, for example, Patent Document 1).

Patent Document 1: Japanese Patent Laid-open Publication No. 2015-043470

SUMMARY

In one exemplary embodiment, a forming method of a component used in a plasma processing apparatus includes irradiating an energy beam to a source material of the component while supplying the source material based on a surface state of the component.

DETAILED DESCRIPTION

Figure 1:
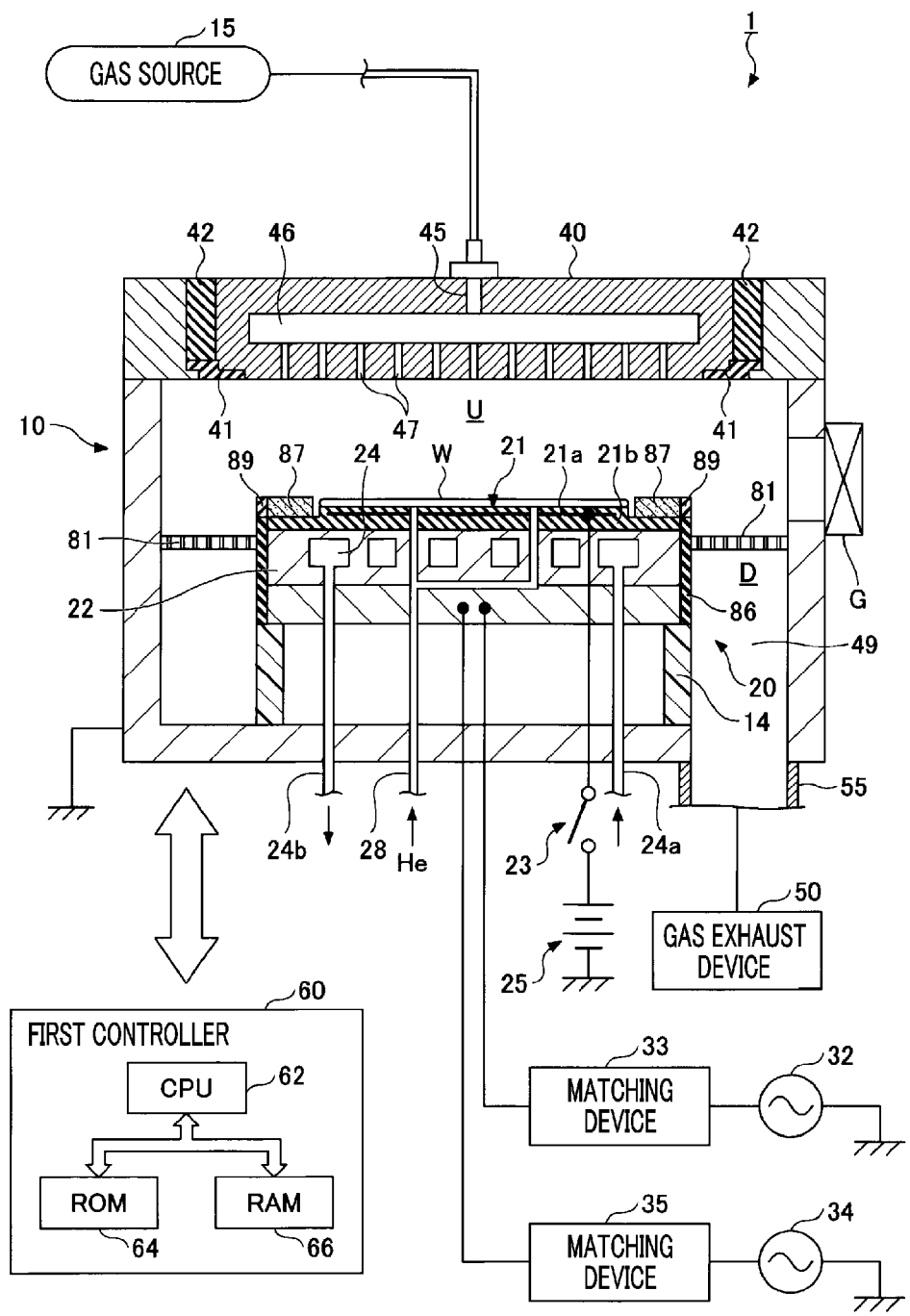
FIG. 1 is a diagram illustrating an example of a plasma processing apparatus according to an exemplary embodiment.

Hereinafter, exemplary embodiments for implementing the present disclosure will be described with reference to the drawings. Further, in the present specification and the drawings, substantially the same components will be denoted by the same reference numerals, and redundant descriptions thereof will be omitted.

[Plasma Processing Apparatus]First, an example of a plasma processing apparatus 1 will be described with reference to FIG. 1. The plasma processing apparatus 1 according to the present exemplary embodiment is a parallel-plate capacitively-coupled plasma (CCP) processing apparatus. The plasma processing apparatus 1 has a plasma forming mechanism that configured to form plasma for etching a surface of a wafer W. Further, the plasma processing apparatus 1 is an example of a substrate processing system that has a component placed within a processing vessel 10 and processes a substrate, and the component is formed by irradiating an energy beam to a source material of the component while supplying the source material based on a surface state of the component.

The plasma processing apparatus 1 has the substantially cylindrical processing vessel 10. An inner surface of the processing vessel 10 is alumite-treated (anodically oxidized). Within the processing vessel 10, plasma processing such as etching, film formation, or the like is performed on the wafer W by plasma.

A placing table 20 has a base 22 and an electrostatic chuck 21. The wafer W is placed on a top surface of the electrostatic chuck 21. The base 22 is made of, e.g., Al, Ti, SiC, or the like.

The electrostatic chuck 21 is provided on the base 22. The electrostatic chuck 21 has a structure in which an electrode film 21a is embedded within an insulator 21b. A DC power supply 25 is connected to the electrode film 21a via a switch 23. When the switch 23 is turned on and a DC voltage is applied from the DC power supply 25 to the electrode film 21a, the wafer W is attracted to and held on the electrostatic chuck 21 by a Coulomb force.

An annular edge ring 87 is placed to surround a peripheral portion of the wafer W. The edge ring 87 is made of, e.g., Si and configured to converge plasma toward the surface of the wafer W within the processing vessel 10 to improve the efficiency of the plasma processing.

The placing table 20 is supported at a bottom portion of the processing vessel 10 by a support body 14. A flow path 24 through which a temperature control medium (coolant, heat transfer medium) flows is formed within the base 22. The coolant or the heat transfer medium, e.g., cooling water, brine or the like, output from a chiller circulates in order of a coolant inlet line 24a, the flow path 24, a coolant outlet line 24b, and the chiller. The placing table 20 dissipates heat by the coolant circulated as described above to be cooled. The coolant and the heat transfer medium include fluid and gas.

A heat transfer gas such as helium gas (He) or argon gas (Ar) supplied from a heat transfer gas source passes through a gas supply line 28 and is supplied to a gap between a top surface of the electrostatic chuck 21 and a rear surface of the wafer W. With this configuration, the wafer W is controlled to a predetermined temperature by the coolant or the heat transfer medium circulating through the flow path 24 and the heat transfer gas supplied to the rear surface of the wafer W.

A first high frequency power supply 32 is connected to the placing table 20 via a first matching device 33 and is configured to apply a high frequency power HF for plasma formation with a first frequency (e.g., 40 MHz) to the placing table 20. A second high frequency power supply 34 is connected to the placing table 20 via a second matching device 35 and is configured to apply a high frequency power LF for bias voltage generation with a second frequency lower (e.g., 13.56 MHz) than the first frequency to the placing table 20. With this configuration, the placing table 20 also serves as a lower electrode. Although the high frequency power HF for plasma formation is applied to the placing table 20 in the present exemplary embodiment, the high frequency power HF may be applied to a shower head 40.

The first matching device 33 is configured to match an output impedance of the first high frequency power supply 32 and a load impedance at a plasma side. The second matching device 35 is configured to match an internal impedance of the second high frequency power supply 34 and the load impedance at the plasma side.

The shower head 40 is disposed at a ceiling of the processing vessel 10 and closes the ceiling via a cylindrical shield ring 42 provided at an outer edge of the shower head 40. The shower head 40 may be made of silicon. The shower head 40 also serves as a facing electrode (upper electrode) facing the placing table 20 (lower electrode). At a peripheral portion of the shower head 40, a top shield ring 41 made of quartz ($SiO_2$) is provided on a lower surface of the shield ring 42.

An annular cover ring 89 and an annular insulator ring 86 are placed on a side surface of the placing table 20 and a peripheral portion of the edge ring 87. The cover ring 89 and the insulator ring 86 may be made of quartz.

A gas inlet port 45 is formed in the shower head 40. A diffusion space 46 is provided within the shower head 40. A gas output from a gas source 15 is supplied and diffused into the diffusion space 46 through the gas inlet port 45 and then is supplied into a plasma processing space U within the processing vessel 10 through a plurality of gas supply holes 47.

A gas exhaust port 55 is formed at a bottom surface of the processing vessel 10. The processing vessel 10 is evacuated and decompressed by a gas exhaust device 50 connected to the gas exhaust port 55. Accordingly, a pressure within the processing vessel 10 can be maintained at a predetermined vacuum level. A gate valve G is provided at a sidewall of the processing vessel 10. The gate valve G is opened or closed when the wafer W is carried into and out of the processing vessel 10.

An annular baffle plate 81 is provided at an upper portion of a gas exhaust path 49 that is formed above the gas exhaust port 55 to partition the plasma processing space U and a gas exhaust space D and also rectify the gas.

The plasma processing apparatus 1 includes a first controller 60 configured to control the overall operation of the plasma processing apparatus 1. The first controller 60 includes a central processing unit (CPU) 62, a read only memory (ROM) 64 and a random access memory (RAM) 66. The CPU 62 executes a plasma processing such as etching or the like based on recipes stored in a storage such as the RAM 66 or the like. The recipes include information for controlling the plasma processing apparatus under the processing conditions, such as processing time, pressure (gas exhaust), high frequency power and voltage, various gas flow rates, temperature within the processing vessel (temperature of the upper electrode, temperature of the processing vessel side wall, temperature of the wafer W, temperature of the electrostatic chuck, etc.), temperature of the coolant, and the like. The recipes indicating such programs and processing conditions may be stored in a hard disk or a semiconductor memory. Alternatively, the recipes may be set at a predetermined region in a portable computer-readable storage medium, such as a CD-ROM, a DVD, or the like, to be readable.

When the plasma processing is performed in the plasma processing apparatus 1 configured as described above, opening/closing of the gate valve G is controlled. Then, the wafer W is carried into the processing vessel 10 and placed on the placing table 20 by moving lifter pins up and down. When the DC voltage is applied from the DC power supply 25 to the electrode film 21a, the wafer W is attracted and held to the electrostatic chuck 21.

The plasma forming mechanism includes the gas source 15, the first high frequency power supply 32 and the second high frequency power supply 34. The gas source 15 outputs and supplies a processing gas into the processing vessel 10. The first high frequency power supply 32 applies the first high frequency power to the placing table 20. The second high frequency power supply 34 applies the second high frequency power to the placing table 20. Accordingly, the plasma forming mechanism forms plasma in the plasma processing space U. The plasma processing is performed on the wafer W by the action of the formed plasma.

After the plasma processing is performed, the DC voltage whose polarity is opposite to that of the voltage applied at the time of attracting the wafer W is applied from the DC power supply 25 to the electrode film 21a, and charges on the wafer W are neutralized. The processed wafer W is separated from the electrostatic chuck 21 by moving the lifter pins up and down to be carried out to the outside of the processing vessel 10 when the gate valve G is opened.

[Configuration of 3D Printer]

Figure 2:
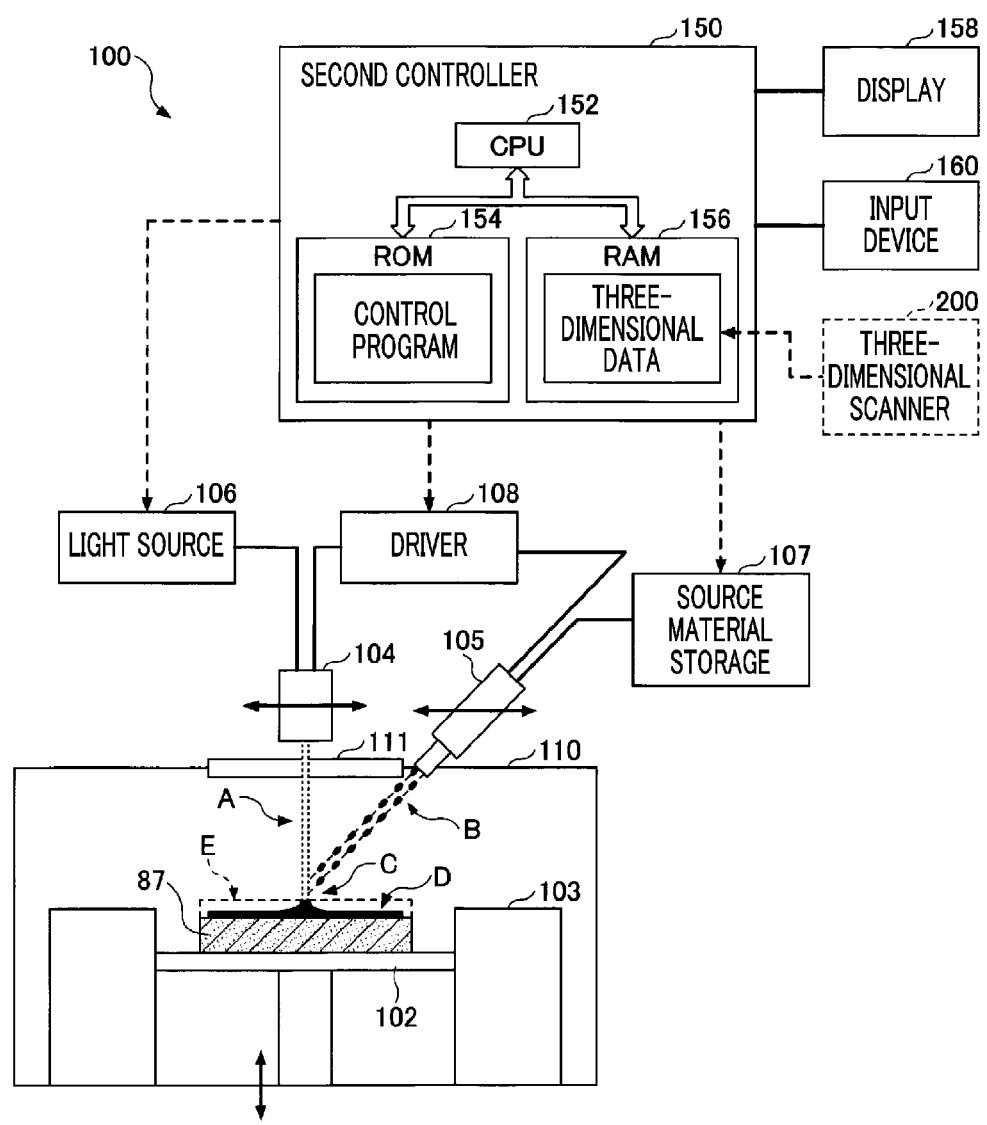
FIG. 2 is a diagram illustrating an example of a configuration of a 3D printer according to the exemplary embodiment.

Hereinafter, a configuration example of a 3D printer 100 will be described with reference to FIG. 2. FIG. 2 illustrates an example of a configuration of the 3D printer 100 according to the exemplary embodiment. The 3D printer 100 according to the present exemplary embodiment is an example of a device configured to restore a component (a consumable component) consumed by the plasma. The device configured to restore the consumable component is not limited to the configuration of the 3D printer 100 illustrated in FIG. 2.

In the present exemplary embodiment, the edge ring 87 will be described as an example of the consumable component to be restored by the 3D printer 100. However, the consumable component is not limited thereto, and may be, e.g., the cover ring 89, the insulator ring 86, the top shield ring 41, or the like. Also, the consumable component may be any component that is placed in the plasma processing apparatus 1 and can be separated (replaced) from the plasma processing apparatus 1.

The 3D printer 100 can form a three-dimensional object in a chamber 110. In the present exemplary embodiment, the edge ring 87 is formed as the three-dimensional object. Herein, a consumable part of the edge ring 87 is measured in advance and a three-dimensional shape of the consumable part of the edge ring 87 is restored by using the 3D printer 100 based on the measurement result, and, thus, the edge ring 87 is re-formed.

During the restoration, the edge ring 87 is placed on a placing surface of a stage 102 provided on a table 103. The stage 102 can be moved up and down, for example, to be gradually lowered as the restoration of the edge ring 87 progresses.

In the present exemplary embodiment, powder of SiC serving as a source material is stored in a source material storage 107. The source material just needs to be the same as the material of the edge ring 87. For example, the edge ring 87 may be made of any one of quartz, Si, and tungsten. In this case, powder of quartz, Si or tungsten is stored in the source material storage 107. Further, the source material is not limited to powder form, but may be in wire form. SiC powder B illustrated in FIG. 2 is supplied from the source material storage 107 and injected into the chamber 110 through a source material supply head 105 so as to be used to restore the consumption of the edge ring 87. Desirably, the source material storage 107 and the source material supply head 105 are placed outside the chamber 110.

While the SiC powder B is supplied into the chamber 110, an energy beam is irradiated to melt the SiC powder B being supplied. In the present exemplary embodiment, a laser beam A (optical laser) is used as the energy beam to be irradiated. The laser beam A is output from a light source 106 and irradiated to a predetermined position determined by a laser scanning device 104 configured to perform a two-dimensional scanning. Desirably, the light source 106 and the laser scanning device 104 are placed outside the chamber 110.

The laser scanning device 104 scans the laser beam A in at least two-dimensional (XY) direction above the stage 102. For example, the laser scanning device 104 is controlled to move an irradiation spot of the laser beam A above the stage 102 based on a consumption state (consumption amount, consumption position (consumption area), consumption shape) of the edge ring 87. Specifically, the laser scanning device 104 scans in the two-dimensional (XY) direction under the control of a second controller 150 as the restoration of the edge ring 87 progresses. For example, in FIG. 2, the consumption state of the edge ring 87 is indicated by a dotted line E. The 3D printer restores the consumption of edge ring 87 to an original state of new product (i.e., a state indicated by the dotted line E).

At this time, the laser beam A irradiated from the laser scanning device 104 in the two-dimensional direction is irradiated to the irradiation spot above the stage 102 via a ceiling portion of the chamber 110, e.g., a laser transmission window 111 provided right above the center of the stage 102. The laser beam A heats the SiC powder B on the edge ring 87 (see C in FIG. 2), melts and solidifies the powder B and forms a solidified layer D. The solidified layer D is stacked on a top surface of the edge ring 87 so that the edge ring 87 can be restored and re-formed.

The laser scanning device 104 and the source material supply head 105 are moved to a predetermined position as the second controller 150 drives a driver 108. In the chamber 110, a mechanism capable of supplying an inert gas and evacuating the inside of the chamber 110 may be provided.

The second controller 150 includes a CPU 152, a ROM 154 and a RAM 156. The second controller 150 controls the supply of the source material powder from the source material storage 107 and the source material supply head 105 and controls the moving up and down of the stage 102. Further, the second controller 150 controls the turning on and off of the light source 106 and the scanning of the laser scanning device 104 and also controls the driver 108. Accordingly, the second controller 150 controls the restoration of the edge ring 87.

A control program executed by the CPU 152 is stored in, e.g., the ROM 154. The CPU 152 controls the restoration of the edge ring 87 by executing the control program based on three-dimensional data stored in, e.g., the RAM 156. Further, the control program may be stored in a fixed storage medium or may be stored in a detachable and computer-readable storage medium such as various flash memories or optical (magnetic) disks.

Furthermore, the second controller 150 includes a display 158 and an input device 160 such as a keyboard or a pointing device. The display 158 is used to display the restoration progress of the edge ring 87. The input device 160 is used to input a control parameter for setting or an instruction such as the start and stop of the restoration of the edge ring 87.

The consumption state of the edge ring 87 is measured by a non-contact type three-dimensional scanner 200 (hereinafter, simply referred to as "three-dimensional scanner 200"). That is, the consumption state of the edge ring 87 is measured by the three-dimensional scanner 200 and the measured information is transmitted to the second controller 150. The second controller 150 creates three-dimensional data which are restoration information based on the measured information and stores the created three-dimensional data in the RAM 156.

Hereinafter, a process of measuring the consumption state of the edge ring 87, which is performed by the three-dimensional scanner 200 before the restoration process, will be described.

[Configuration of Three-Dimensional Scanner]

Figure 3:
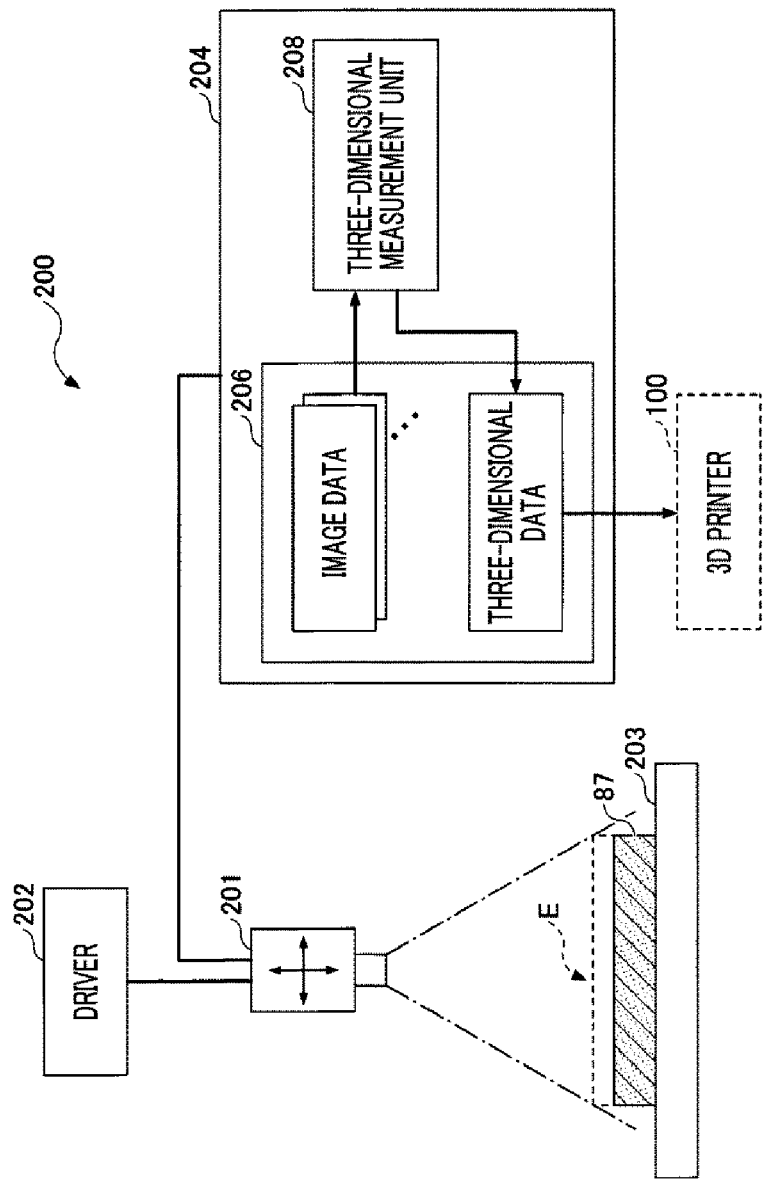
FIG. 3 is a diagram illustrating an example of a configuration of a three-dimensional scanner according to the exemplary embodiment.

First, a configuration example of the three-dimensional scanner 200 will be described with reference to FIG. 3. FIG. 3 illustrates an example of a configuration of the three-dimensional scanner 200 according to the exemplary embodiment. The three-dimensional scanner 200 according to the present exemplary embodiment is an example of a device configured to measure the consumption state of the edge ring 87, but is not limited to this configuration.

The three-dimensional scanner 200 includes a measurement stage 203, an imaging unit 201, a driver 202 and a detection controller 204. The detection controller 204 includes a storage 206 and a three-dimensional measurement unit 208. The edge ring 87 is placed on a placing surface of the measurement stage 203. The consumption state of the edge ring 87 is indicated by a dotted line E.

The imaging unit 201 is placed facing the measurement stage 203 and configured to image the edge ring 87. The driver 202 is configured to move the imaging unit 201 in a height direction or a horizontal direction in response to an instruction from the detection controller 204. The imaging unit 201 scans the consumption state of the edge ring 87 in a three-dimensional manner and obtains image data.

The image data are transmitted to the detection controller 204 and then stored in the storage 206. The three-dimensional measurement unit 208 is configured to create three-dimensional data from the three-dimensional consumption state (three-dimensional consumption amount, consumption position (consumption area), consumption shape) of the edge ring 87 based on a difference between the image data and the state of the edge ring 87 at the time when the edge ring 87 is a new product. The three-dimensional data are transmitted to the 3D printer 100.

[Operation of Three-Dimensional Scanner]

Figure 4:
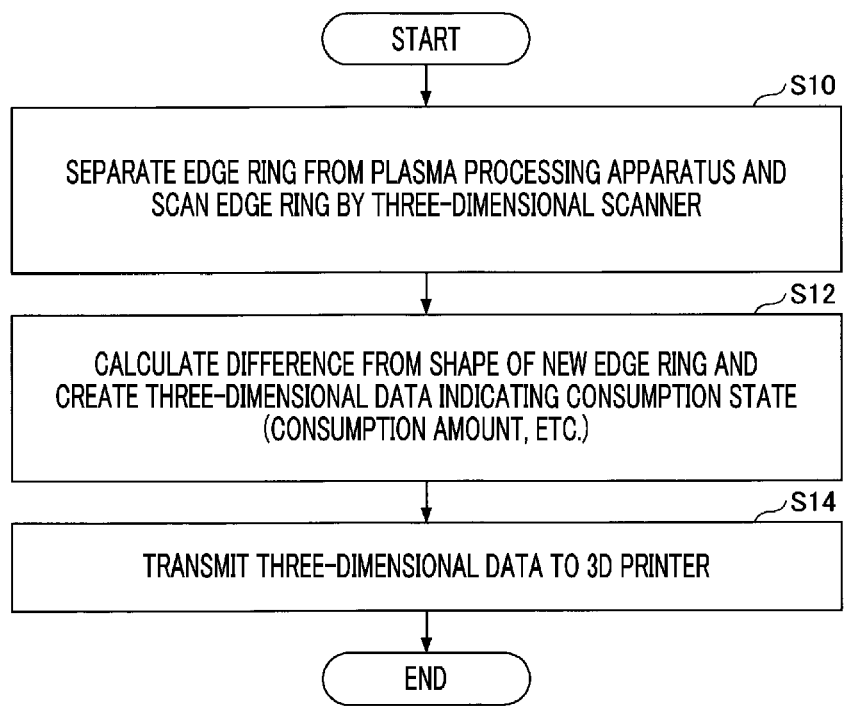
FIG. 4 is a flowchart showing an example of a three-dimensional data generation processing according to the exemplary embodiment.

Hereinafter, an operation example of the three-dimensional scanner 200 will be described with reference to FIG. 4. FIG. 4 is a flowchart showing an example of a three-dimensional data creation processing according to the exemplary embodiment. The present processing is started when the plasma processing is performed for a predetermined time period in the plasma processing apparatus 1 or when the edge ring 87 placed in the plasma processing apparatus 1 is consumed by a predetermined amount or more. The consumption amount of the edge ring 87 may be determined based on etching characteristics, such as an etching shape, an etching rate, etc., of the processed wafer W. The consumed edge ring 87 is separated from the plasma processing apparatus 1 and then transferred to the three-dimensional scanner 200 (process S10).

The edge ring 87 is placed on the placing surface of the measurement stage 203. The imaging unit 201 scans the edge ring 87 in a three-dimensional manner (process S10).

The image data of the scanned edge ring 87 are transmitted to the detection controller 204.

The three-dimensional measurement unit 208 creates three-dimensional data indicating three-dimensional consumed amount, consumed position, consumed shape of the edge ring 87 based on the difference between the image data of the edge ring 87 and the state of the edge ring 87 at the time when the edge ring 87 is a new product (process S12). The three-dimensional measurement unit 208 transmits the created three-dimensional data to the 3D printer 100 (process S14), and the present processing is ended.

Accordingly, the 3D printer 100 obtains the three-dimensional data indicating the consumption state of the edge ring 87 and restores the consumed part of the edge ring 87 based on the three-dimensional data to re-form the edge ring 87 to an original state of new product.

[Operation of 3D Printer]

Figure 5:
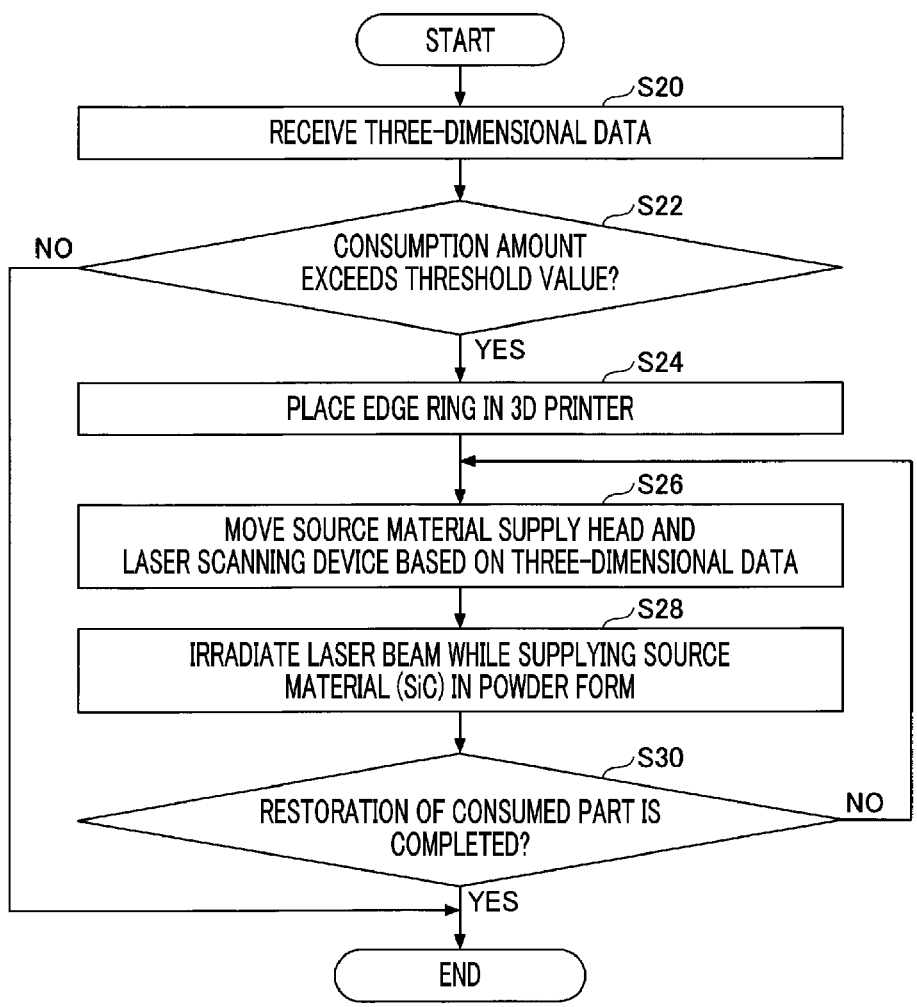
FIG. 5 is a flowchart showing an example of a processing of restoring and forming a component according to the exemplary embodiment.

Hereinafter, an operation example of the 3D printer 100 will be described with reference to FIG. 5. FIG. 5 is a flowchart showing an example of a processing of restoring and forming a component according to the exemplary embodiment. When the present processing is started, the second controller 150 receives the three-dimensional data from the three-dimensional scanner 200 (process S20).

Then, the second controller 150 stores the three-dimensional data in the storage such as the RAM 156 or the like. The second controller 150 determines whether the consumption amount of the edge ring 87 exceeds a threshold value based on the three-dimensional data (process S22). If the second controller 150 determines that the consumption amount of the edge ring 87 does not exceed the threshold value, the edge ring 87 is consumed by a predetermined amount or less at this time. Therefore, the second controller 150 determines that restoration does not need to be performed and ends the present processing.

In the process S22, if the second controller 150 determines that the consumption amount of the edge ring 87 exceeds the threshold value, the second controller 150 determines that the edge ring 87 needs to be restored and then transfers the edge ring 87 to the 3D printer 100 and places the edge ring 87 on the stage 102 (process S24).

Then, the second controller 150 controls the driver 108 to move each of the source material supply head 105 and the laser scanning device 104 based on the three-dimensional data (process S26). Then, the second controller 150 irradiates the laser beam A while supplying the SiC powder B serving as the source material from the source material storage 107 (process S28). Accordingly, the SiC powder B is melted (see C in FIG. 2) and solidified to form the solidified layer (see D in FIG. 2) at a position determined based on the consumption state of the edge ring 87.

Then, the second controller 150 determines whether the restoration of the consumed part of the edge ring 87 is completed (process S30). If the second controller 150 determines that the restoration of the consumed part of the edge ring 87 is not completed, the second controller 150 returns to the process S26 and repeats the processing from the process S26 to the process S30. In the process S30, if the second controller 150 determines that the restoration of the consumed part of the edge ring 87 is completed, the second controller 150 ends the present processing.

As described above, the forming method of the component, such as the edge ring 87, according to the present exemplary embodiment includes the process of irradiating the energy beam to the source material of the component while supplying the source material based on three-dimensional data indicating a consumption state of the component.

Accordingly, the component, such as the edge ring 87, can be restored. Therefore, even if the component, such as the edge ring 87, is consumed by a predetermined amount or more, the component can be restored by the 3D printer 100 and provided again in the plasma processing apparatus 1, and, thus, the component does not need to be replaced with a new one. Accordingly, it is possible to extend the lifetime of the component.

The consumption state of the component to be restored is measured by using the three-dimensional scanner 200. After the measurement, the component is restored by irradiating the energy beam to the source material of the component while supplying the source material, based on the three-dimensional data indicating the consumption state of the component. Accordingly, it is possible to reduce the lead time required to manufacture the component.

However, the forming method of the component, such as the edge ring 87, according to the present exemplary embodiment is not limited to the process of irradiating the energy beam to the source material of the component while supplying the source material based on three-dimensional data indicating the consumption state of the component. For example, if the edge ring 87 needs to be re-formed due to other reasons than the consumption of the component by the plasma, the component may be re-formed by irradiating the energy beam to the source material of the component while supplying the source material based on three-dimensional data indicating the surface state of the component.

[Kind of 3D Printer]

In the present exemplary embodiment, a directed energy deposition 3D printer is described as an example of the 3D printer 100 configured to restore the edge ring 87. In the directed energy deposition 3D printer, a component is restored by melting a source material in powder form or wire form in a space within the chamber 110 while supplying the source material, and depositing the melted source material at a predetermined position of the component. However, the 3D printer 100 is not limited to a 3D printer configured as described above.

For example, a powder bed fusion 3D printer may be used. In the powder bed fusion 3D printer, a component is restored by repeating an operation of spreading a source material in powder form on an entire surface of a stage, melting the source material with a laser beam, spreading the source material in powder form on the entire surface and melting the source material with a laser beam. Other 3D printers than the directed energy deposition 3D printer and the powder bed fusion 3D printer may be used in the method of restoring a component. Examples of the other 3D printers may include a binder jetting 3D printer, a sheet lamination 3D printer, a vat photopolymerization (stereolithography) 3D printer and a material extrusion (heat-melting lamination) 3D printer.

If the material of the component is a non-metal material such as resin or oxide, ultraviolet light and light in other frequency band may be used as the energy beam in the process of irradiating the energy beam while supplying the non-metal material by the 3D printer. Therefore, the forming method of the component according to the present exemplary embodiment enables the restoration of the component made of the non-metal material such as resin as well as the component made of the metal material. Examples of the 3D printer for the case where the material of the component is the non-metal material may include a material jetting 3D printer configured to solidify the non-metal material, which is jetted from an inkjet head, with the ultraviolet light and laminate the non-metal material.

The forming method of the component and the substrate processing system have been described above, but the forming method of the component and the substrate processing system of the present disclosure are not limited to the above-described exemplary embodiments and can be variously changed and modified without departing from the scope of the present disclosure. The contents described in the above-described exemplary embodiments may be combined without contradicting each other.

For example, in the above-described exemplary embodiments, the forming method of the edge ring 87 including the process of measuring the consumption state of the edge ring 87 and the process of irradiating the energy beam to the source material of the edge ring 87 while supplying the source material based on the measured consumption state of the edge ring 87 is described. However, the present disclosure is not limited thereto, and the method may include a process of measuring a surface state of the edge ring 87 and a process of irradiating the energy beam to the source material of the edge ring 87 while supplying the source material based on the measured surface state of the edge ring 87.

The surface state of the component, such as the edge ring 87, may include scratch or damage as well as the consumption of the edge ring 87 by the plasma. Even when the surface of the component is damaged or the like, the component can be restored or re-formed by measuring the surface state of the component including the damaged part and performing the forming method of the component according to the present disclosure based on the measurement result.

The plasma processing apparatus according to the present disclosure can be applied to any type of capacitively coupled plasma (CCP), inductively coupled plasma (ICP), radial line slot antenna, electron cyclotron resonance plasma (ECR) and helicon wave plasma (HWP).

In the present specification, the wafer W is described as an example of the substrate. However, the substrate is not limited thereto, but may include various substrates used for liquid crystal display (LCD) and flat panel display (FPD), CD substrates, print boards, or the like.

According to the exemplary embodiment as described above, consumable components can be restored.

We claim:

1. A restoring method of a consumed component used in a plasma processing apparatus, the restoring method comprising:
   separating the consumed component from the plasma processing apparatus;
   transferring the consumed component to a three-dimensional scanner;
   scanning the consumed component in a three-dimensional manner and obtaining image data of the consumed component by an imaging unit of the three-dimensional scanner;
   obtaining three-dimensional data indicating a three-dimensional consumed amount, a consumed position and a consumed shape of the consumed component based on a difference between the image data of the consumed component and an original state of a new product;
   calculating a consumed amount of the consumed component that exceeds a threshold value based on the three-dimensional data; and
   irradiating an energy beam to a source material of the component while supplying the source material based on the three-dimensional data.

2. The restoring method of the component of claim 1, wherein the source material is in powder form or wire form.

3. The restoring method of the component of claim 1, wherein the source material is any one of quartz, SiC, Si and tungsten.

4. The restoring method of the component of claim 1, wherein, when the source material is metal, an optical laser or electron beam is used as the energy beam.

5. The restoring method of the component of claim 1, wherein the component is at least one of an edge ring, a cover ring, an insulator ring or a top shield ring.

6. The restoring method of the component of claim 1, wherein, when the source material is non-metal, an ultraviolet light is used as the energy beam.

* * * * *